United States Patent
Lee et al.

(10) Patent No.: US 9,865,481 B2
(45) Date of Patent: Jan. 9, 2018

(54) PACKAGE AND METHOD FOR INTEGRATION OF HETEROGENEOUS INTEGRATED CIRCUITS

(71) Applicant: Taiwan Semiconductor Manufacturing Co., Ltd., Hsin-Chu (TW)

(72) Inventors: Wan-Yu Lee, Taipei (TW); Chun-Hao Tseng, Taichung (TW); Jui Hsieh Lai, Taoyuan (TW); Tien-Yu Huang, Shuishang Township (TW); Ying-Hao Kuo, Hsinchu (TW); Kuo-Chung Yee, Taoyuan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/223,609

(22) Filed: Jul. 29, 2016

(65) Prior Publication Data
US 2016/0343697 A1    Nov. 24, 2016

Related U.S. Application Data

(62) Division of application No. 14/015,513, filed on Aug. 30, 2013, now Pat. No. 9,419,156.

(51) Int. Cl.
*H01L 21/56* (2006.01)
*H01L 23/48* (2006.01)
(Continued)

(52) U.S. Cl.
CPC ...... *H01L 21/563* (2013.01); *H01L 21/31111* (2013.01); *H01L 21/481* (2013.01);
(Continued)

(58) Field of Classification Search
CPC ... H01L 21/48; H01L 21/4803; H01L 21/481; H01L 21/4846; H01L 21/4857;
(Continued)

(56) References Cited

U.S. PATENT DOCUMENTS 5,353,498 A * 10/1994 Fillion ............... H01L 21/568
257/E21.505
7,217,590 B2    5/2007 Pourquier et al.
(Continued)

OTHER PUBLICATIONS

Non-Final Office Action dated Sep. 5, 2014 for U.S. Appl. No. 14/015,513.
(Continued)

*Primary Examiner* — Eduardo A Rodela
(74) *Attorney, Agent, or Firm* — Eschweiler & Potashnik, LLC

(57) ABSTRACT

A package for holding a plurality of heterogeneous integrated circuits includes a first chip having a first conductive pad and a first substrate including a first semiconductor, and a second chip having a second conductive pad and a second substrate including a second semiconductor. The second semiconductor is different from the first semiconductor. The package also includes a molding structure in which the first chip and the second chip are embedded, a conductive structure over the first chip and conductively coupled to the first conductive pad and over the second chip and conductively coupled to the second conductive pad, and a passivation layer over the conductive structure. The passivation layer comprises an opening defined therein which exposes a portion of the second chip.

20 Claims, 5 Drawing Sheets

(51) Int. Cl.

| | |
|---|---|
| *H01L 21/50* | (2006.01) |
| *H01L 23/31* | (2006.01) |
| *H01L 31/0232* | (2014.01) |
| *H01L 31/09* | (2006.01) |
| *H01L 23/538* | (2006.01) |
| *H01L 21/48* | (2006.01) |
| *H01L 23/00* | (2006.01) |
| *H01L 27/146* | (2006.01) |
| *H01L 21/311* | (2006.01) |
| *H01L 21/683* | (2006.01) |
| *H01L 21/768* | (2006.01) |
| *H01L 23/29* | (2006.01) |
| *H01L 25/16* | (2006.01) |
| *H01L 25/00* | (2006.01) |

(52) U.S. Cl.
CPC .......... *H01L 21/4857* (2013.01); *H01L 21/50* (2013.01); *H01L 21/565* (2013.01); *H01L 21/568* (2013.01); *H01L 21/6836* (2013.01); *H01L 21/76838* (2013.01); *H01L 23/293* (2013.01); *H01L 23/3114* (2013.01); *H01L 23/3171* (2013.01); *H01L 23/48* (2013.01); *H01L 23/538* (2013.01); *H01L 23/5383* (2013.01); *H01L 23/5389* (2013.01); *H01L 24/06* (2013.01); *H01L 24/24* (2013.01); *H01L 24/82* (2013.01); *H01L 25/167* (2013.01); *H01L 25/50* (2013.01); *H01L 27/14618* (2013.01); *H01L 31/0232* (2013.01); *H01L 31/09* (2013.01); *H01L 2224/24137* (2013.01); *H01L 2924/1032* (2013.01); *H01L 2924/1033* (2013.01); *H01L 2924/10253* (2013.01); *H01L 2924/1305* (2013.01); *H01L 2924/13091* (2013.01)

(58) Field of Classification Search
CPC ..... H01L 21/4889; H01L 21/50; H01L 21/56; H01L 21/563; H01L 21/568; H01L 2021/60; H01L 2021/60015; H01L 2021/6006; H01L 23/145; H01L 23/28; H01L 23/31; H01L 23/3107; H01L 23/481; H01L 23/482; H01L 23/538; H01L 23/5381; H01L 23/5383; H01L 23/5386; H01L 31/02002; H01L 31/0203; H01L 33/52; H01L 33/54; H01L 33/62
See application file for complete search history.

(56) References Cited

U.S. PATENT DOCUMENTS

| | | | |
|---|---|---|---|
| 7,838,357 B2* | 11/2010 | Bogner | ................. H01L 33/486 438/200 |
| 8,058,100 B2 | 11/2011 | Pu et al. | |
| 2004/0238909 A1 | 12/2004 | Boon et al. | |
| 2005/0269687 A1 | 12/2005 | Forcier | |
| 2008/0274579 A1 | 11/2008 | Yang et al. | |
| 2009/0046183 A1 | 2/2009 | Nishida et al. | |
| 2010/0213501 A1* | 8/2010 | Kamei | .................... H01L 33/42 257/99 |
| 2011/0057104 A1 | 3/2011 | Yao et al. | |
| 2011/0080516 A1 | 4/2011 | Yi et al. | |
| 2011/0198762 A1 | 8/2011 | Scanlan | |
| 2011/0298101 A1* | 12/2011 | Pagaila | ................... H01L 24/95 257/659 |
| 2012/0104590 A1* | 5/2012 | Do | .......................... H01L 25/16 257/690 |
| 2012/0228664 A1* | 9/2012 | Terano | ................... B82Y 20/00 257/99 |
| 2015/0049498 A1* | 2/2015 | Zhou | ...................... F21V 21/00 362/382 |

OTHER PUBLICATIONS

Final Office Action dated Feb. 3, 2015 for U.S. Appl. No. 14/015,513.
Non-Final Office Action dated Jul. 23, 2015 for U.S. Appl. No. 14/015,513.
Final Office Action dated Feb. 2, 2016 for U.S. Appl. No. 14/015,513.
Notice of Allowance dated Apr. 1, 2016 for U.S. Appl. No. 14/015,513.

* cited by examiner

PACKAGE AND METHOD FOR INTEGRATION OF HETEROGENEOUS INTEGRATED CIRCUITS

REFERENCE TO RELATED APPLICATION

This Application is a Divisional of U.S. application Ser. No. 14/015,513 filed on Aug. 30, 2013, the contents of which is hereby incorporated by reference in its entirety.

BACKGROUND

Optical signals are usable for data transmission between optical devices. Optical signal transmitters and/or receivers are often fabricated in one type of integrated circuit (IC) chip, such as those using semiconductor substrates primarily made of class III-V semiconductor compound, while signal processor ICs controlling the optical signal transmitters and/or receivers often employ a second type of IC chip, such as those using semiconductor substrates primarily made of silicon (Si). Devices, such as optical devices, employing heterogeneous ICs of different types are useful. However, conductive connection between different types of ICs in a conventional multi-chip module often employs either wire bonding or flip-chip bonding. For wire bonding, the conventional multi-chip module is large and signal speeds are limited. For flip-chip bonding used in a conventional multi-chip module, due to different contact pad metals such as gold (Au) or aluminum/copper (Al/Cu) pads, two different bump formation processes such as gold-gold (Au—Au), gold-tin (Au—Sn), and/or tin silver/silver tin copper (SnAg/SnAgCu) are used. These solder bump formation processes in flip-chip bonding add cost and reduce overall yield.

BRIEF DESCRIPTION OF THE DRAWINGS

One or more embodiments are illustrated by way of example, and not by limitation, in the figures of the accompanying drawings, wherein elements having the same reference numeral designations represent like elements throughout.

DETAILED DESCRIPTION

Figure 1:
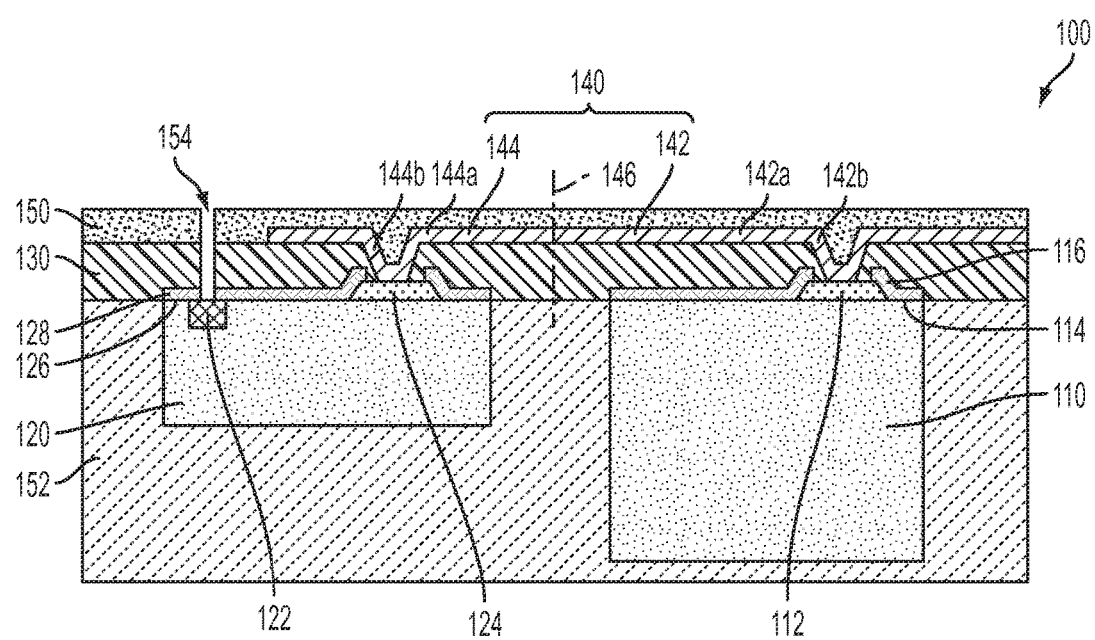
FIG. 1 is a cross-sectional view of a package in accordance with one or more embodiments.

It is understood that the following disclosure provides one or more different embodiments, or examples, for implementing different features of the disclosure. Specific examples of components and arrangements are described below to simplify the present disclosure. These are, of course, examples and are not intended to be limiting. In accordance with the standard practice in the industry, various features in the drawings are not drawn to scale and are used for illustration purposes only.

Moreover, spatially relative terms, for example, "lower," "upper," "horizontal," "vertical," "above," "below," "up," "down," "top," "bottom," "left," "right," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

In some applications, a chip having an optical component (also referred to as an optical chip) is encapsulated by a molded package structure, and the molded package structure is mounted on a PCB substrate. Compared with a configuration without using the molded package structure, the embodiments described herein allow a shortened conductive path between the optical chip and the PCB. In some embodiments, shortened conductive path means lowered parasitic capacitance and resistance along the conductive path, and thus in turn helps to decrease power loss and increase operation frequency of the resulting device. In some embodiments using an interposer to connect the molded package structure and the PCB substrate, a through-silicon-via structure formed in the interposer is capable of being fabricated after mounting the molded package structure to the interposer (i.e., "via-last" process). By doing so, fabrication processes and masks for forming bump structures on corresponding sides of the interposer and the molded package structure are omitted.

FIG. 1 is a cross-sectional view of a package structure 100 in accordance with one or more embodiments. Package structure 100 includes a first chip 110, a second chip 120, a first passivation layer 130, a redistribution structure 140 over first passivation layer 130, and a second passivation layer 150 over redistribution structure 140. Package structure 100 further includes a molding structure 152 surrounding and underneath first chip 110 and second chip 120. In some embodiments, redistribution structure 140 connects multiple chips such as first chip 110 and second chip 120 in a fan-out process, i.e., a process having more chips receiving a particular signal than transmitting that signal such that the signal is "fanned-out".

In some embodiments, first chip 110 includes one or more active components and/or passive components configured to process, receive and/or transmit electrical signals. Examples of passive components include, but are not limited to, resistors, capacitors, and inductors. Examples of active components include, but are not limited to, diodes, field effect transistors (FETs), metal-oxide-semiconductor FETs (MOSFETs), complementary metal-oxide-semiconductor (CMOS) transistors, and bipolar transistors. In some embodiments, first chip 110 includes a bare chip or die. In some embodiments, first chip 110 includes a stack of chips. In some embodiments, first chip 110 is configured to perform predetermined logic, analog, or mixed mode functionality. In some embodiments, first chip 110 has a thickness ranging from 50 micrometers (μm) to 750 μm.

First chip 110 includes at least one conductive pad 112 on an upper surface 114 of first chip 110. Conductive pad 112 is conductively coupled to the one or more active components and/or passive components of first chip 110 for communication of electrical signals between first chip 110 and external circuitry. Example materials of the conductive pad 112 include, but are not limited to, aluminum, copper, or a combination thereof. First chip 110 further has a passivation layer 116 over the upper surface 114. Passivation layer 116 has an opening that exposes at least a portion of conductive pad 112. Example materials of the passivation layer 116 include, but are not limited to, silicon oxide, silicon nitride, low dielectric constant (low-)k dielectric materials such as carbon doped oxides, extremely low-k dielectric materials such as porous carbon doped silicon dioxide, or a combination thereof.

Second chip 120 includes at least one optical component 122 configured to process, receive, and/or transmit optical signals. Second chip 120 is thus also referred to as an optical chip in some applications. Optical signals are electromagnetic signals capable of being shaped and are different from electrical signals which are signals carried by electrical charges, such as electrons, holes, or ions. In some embodiments, optical signals include electromagnetic signals having a wavelength of less than 1 millimeter (mm). Examples of optical components include, but are not limited to, light emitting devices such as lasers and light emitting diodes, light detecting devices such as photo-sensors, optical modulators, and optical couplers. In at least one embodiment, second chip 120 further includes one or more active and/or passive components configured to process, receive and/or transmit electrical signals converted to/from optical signals by the optical component 122. In some embodiments, second chip 110 has a thickness ranging from 150 μm to 350 μm.

Second chip 120 includes at least one conductive pad 124 on an upper surface 126 of first chip 120. Second chip 120 also has a passivation layer 128 over upper surface 126 and exposing a portion of conductive pad 124. Example materials of the conductive pad 124 include, but are not limited to, aluminum, copper, gold, or a combination thereof. Example materials of the passivation layer 128 include, but are not limited to, silicon oxide, silicon nitride, low-k dielectric materials such as carbon doped oxides, extremely low-k dielectric materials such as porous carbon doped silicon dioxide, or a combination thereof. In some embodiments, passivation layer 128 and passivation layers 130 and 150 have an optical opening 154 defined therein to allow transmitting and/or receiving of optical signals by the optical component 122. In at least one embodiment, passivation layer 128 is made of a material transparent to optical signals transmitted and/or received by the optical component 122, and a portion of the optical opening 154 corresponding to the passivation layer 128 is thus omitted. In some embodiments an optical waveguide and reflective surface are arranged to define an optical path from the optical component 122 of the first chip 120 through the optical opening 154 to the waveguide through the reflective surface.

Passivation layer 130 is over and covering conductive pads 112 and 124 and passivation layers 116 and 128. In some embodiments, passivation layer 130 includes epoxy, polyimide, benzocyclobutene (BCB), polybenzoxazole (PBO), or other organic dielectric materials. In one or more embodiments, passivation layer 130 is formed of a material similar to the material used for forming passivation layers 116 or 128, such as silicon oxides, silicon nitrides, low-k dielectric materials, extremely low-k dielectric materials, or a combination thereof. In at least one embodiment, passivation layer 130 is made of a material transparent to optical signals transmitted and/or received by the optical component 122, and a portion of the optical opening 154 corresponding to the passivation layer 130 is thus omitted. In some embodiments, passivation layer 130 has a thickness ranging from 3 μm to 10 μm.

Redistribution structure 140 is conductive and includes a first conductive structure 142 conductively coupled to the conductive pad 112 and a second conductive structure 144 conductively coupled to the conductive pad 124. In the embodiment depicted in FIG. 1, first conductive structure 142 and second conductive structure 144 are connected and in physical contact at a reference line 146. First conductive structure 142 includes a planar portion 142a substantially in parallel with upper surface 114 of first chip 110 and a protrusion 142b connecting the conductive pad 112 and the planar portion 142a. Second conductive structure 144 includes a planar portion 144a substantially in parallel with upper surface 126 of second chip 120 and a protrusion 144b connecting the conductive pad 124 and the planar portion 144a. In the embodiment depicted in FIG. 1, planar portions 142a and 144b are in physical contact with each other at reference line 146. In some embodiments, planar portions 142a and 144b are not in physical contact with each other.

In some embodiments, conductive structures 142 and 144 include copper, aluminum, nickel, gold, tungsten, or a combination thereof. In some embodiments, conductive structures 142 and 144 each have one or more conductive layers suitable for obscuring metal atoms from diffusion into structures above or underneath redistribution structure 140. In some embodiments, conductive structures 142 and 144 are also referred to as post-passivation interconnect (PPI) structures. In some embodiments, conductive structures 142 and 144 are formed using a CMOS Back-End-of-Line (BEOL) process.

Second passivation layer 150 is over and covering redistribution structure 140. In some embodiments, passivation layer 150 includes epoxy, polyimide, benzocyclobutene (BCB), polybenzoxazole (PBO), or other organic dielectric materials. In one or more embodiments, Second passivation layer 150 is formed of a material similar to the material used for forming the passivation layers 116 or 128, such as silicon oxides, silicon nitrides, low-k dielectric materials, extremely low-k dielectric materials, or a combination thereof. In some embodiments, passivation layer 150 and passivation layer 130 are made of different materials. In at least one embodiment, passivation layer 150 is made of a material transparent to optical signals transmitted and/or received by the optical component 122, and a portion of the optical opening 154 corresponding to the passivation layer 150 is thus omitted. In some embodiments, passivation layer 150 has a thickness ranging from 3 μm to 10 μm.

Molding structure 152 is surrounding and underneath first chip 110 and second chip 120 to protect surfaces of chips 110 and 120 that are not covered by passivation layers 130 and 150. In some embodiments, molding structure 152 has a thickness that is sufficient to enclose bottom surfaces of chips 110 and 120. In some embodiments, molding structure 152 comprises a material that has a thermal expansion coefficient about or between those of chips 110 and 120. In some embodiments, molding structure 152 comprises a material that has a thermal expansion coefficient ranging from 4 to 9. In some embodiments, example materials of the molding structure 152 include, but are not limited to silicone, including silicone rubber, resins, including epoxy resins, other resins, or other epoxy materials.

Although only one conductive pad 112 or 124 for each chip 110 or 120 and only two corresponding conductive structures 142 and 144 are depicted in FIG. 1, in some embodiments, there are more than one conductive pad on each chip 110 or 120 and are variously connected by redistribution structure 140. In some embodiments, there are one or more other chips in addition to chips 110 and 120 included in the package structure 100. In some embodiments, only one of first chip 110 and second chip 120 is present, and the other one of first chip 110 and second chip 120 is omitted.

Figure 2:
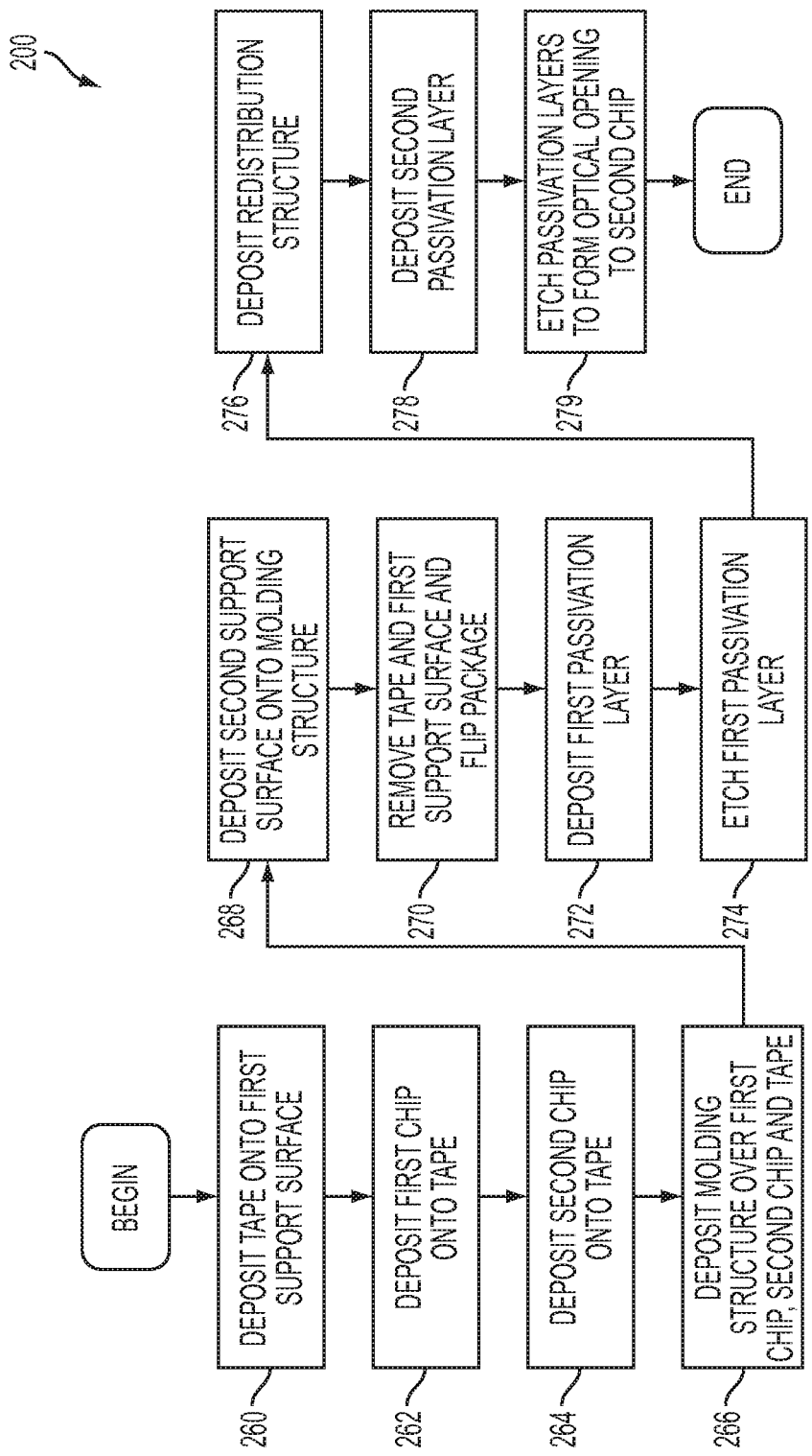
FIG. 2 is a flow chart of a method of making a package in accordance with one or more embodiments.

FIG. 2 is a flow chart of a method of making a package in accordance with one or more embodiments. It is understood that additional processes are not precluded from being performed before, during, and/or after the method 200 depicted in FIG. 2.

In operation 260, tape is deposited onto a first support surface. The tape is a thermal tape for adhering to a first support surface on one side of the tape and adhering to a first chip and the second chip on another side of the tape. If the temperature of the tape is raised sufficiently high, the tape dissolves. In some embodiments, the tape is an ultraviolet (UV) optical tape. The first support surface is a polished, substantially planar, silicon substrate. In some embodiments, the first support surface is glass. In at least some embodiments, the use of glass reduces cost.

Figure 3A:
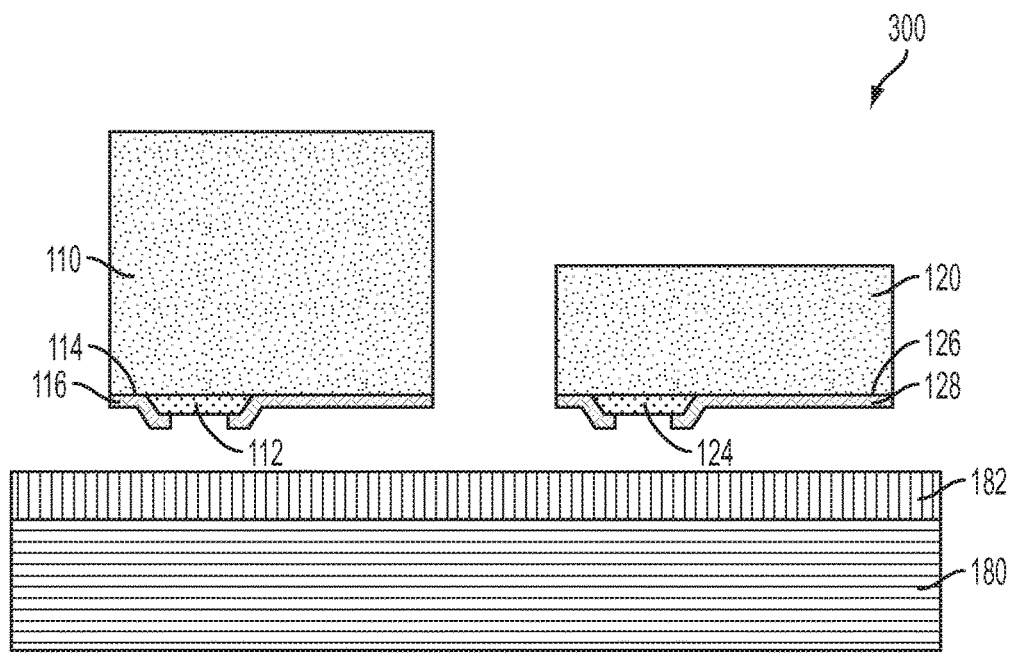
FIGS. 3A-3D are cross-sectional views of a package at various stages of production in accordance with one or more embodiments.

FIG. 3A is a cross-sectional view of a package 100 following operation 260 in accordance with one or more embodiments. Tape 182 is deposited onto a first support surface 180. First chip 110 and second chip 120 are illustrated above the tape 182 prior to contact with the tape.

Returning to FIG. 2, in operation 262, the first chip is deposited onto the tape. The first chip includes one or more active components and/or passive components configured to process, receive and/or transmit electrical signals.

In operation 264, the second chip is deposited onto the tape. The second chip includes at least one optical component configured to process, receive, and/or transmit optical signals. In some embodiments, the first chip and second chip are deposited together.

In operation 266, a molding structure is deposited over the first chip, the second chip and the tape. In some embodiments, the molding structure includes silicone. The molding structure covers the first chip, the second chip and the tape. The molding structure is deposited in a layer between about 50 μm and about 750 μm thick. If the molding structure is too thin, the first chip and second chip are not covered by the molding structure. If the molding structure is too thick, molding structure material is wasted. In some embodiments, the coefficient of thermal expansion is between that of the first chip and the second chip.

In operation 268, a second support surface deposited onto the molding structure. Similar to the first support surface, the second support surface is a polished, substantially planar, silicon substrate. In some embodiments, the first support surface is glass. In at least some embodiments, the use of glass reduces cost. The second support surface adheres to the molding structure. The second support surface functions as a carrier and as a heat sink for the first chip and the second chip.

Figure 3B:
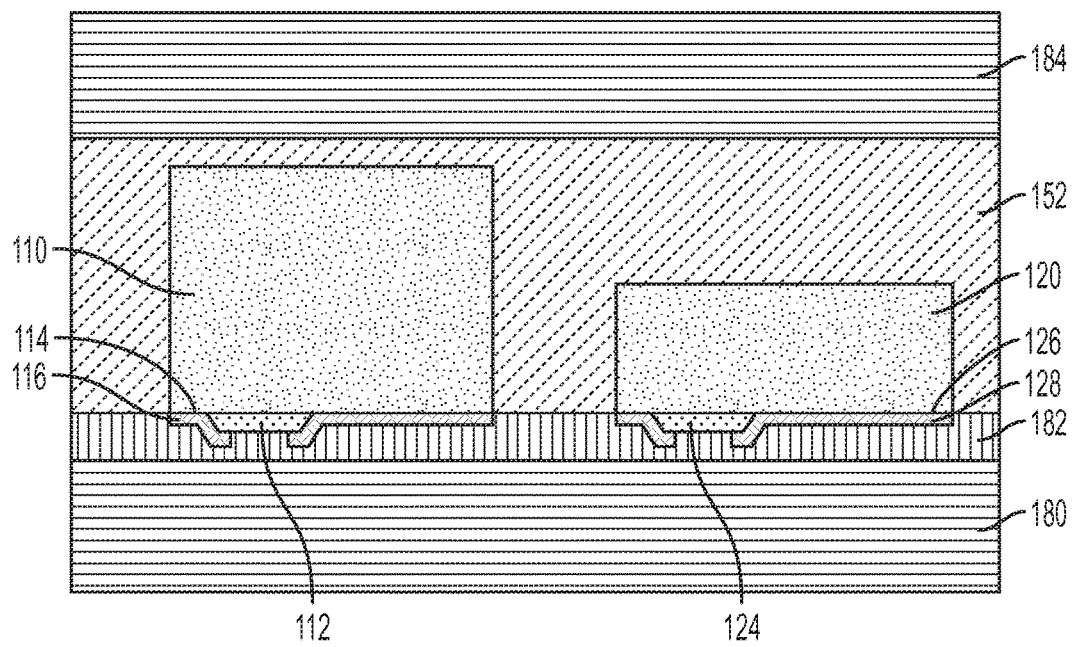

FIG. 3B is a cross-sectional view of the package 100 following operations 262-268 in accordance with one or more embodiments. The first chip 110 and the second chip 120 are deposited onto the tape 182. Molding structure is deposited over the first chip 110, the second chip 120 and the tape 182. A second support surface 184 is deposited onto the molding structure.

Returning to FIG. 2, in operation 270, the tape and first support surface are removed and the package is rotated 180 degrees around an axis passing through FIG. 2 (flipped), as illustrated.

In operation 272, a first passivation layer is deposited over the package. In some embodiments, passivation layer 130 includes epoxy, polyimide, benzocyclobutene (BCB), polybenzoxazole (PBO), or other organic dielectric materials.

Figure 3C:
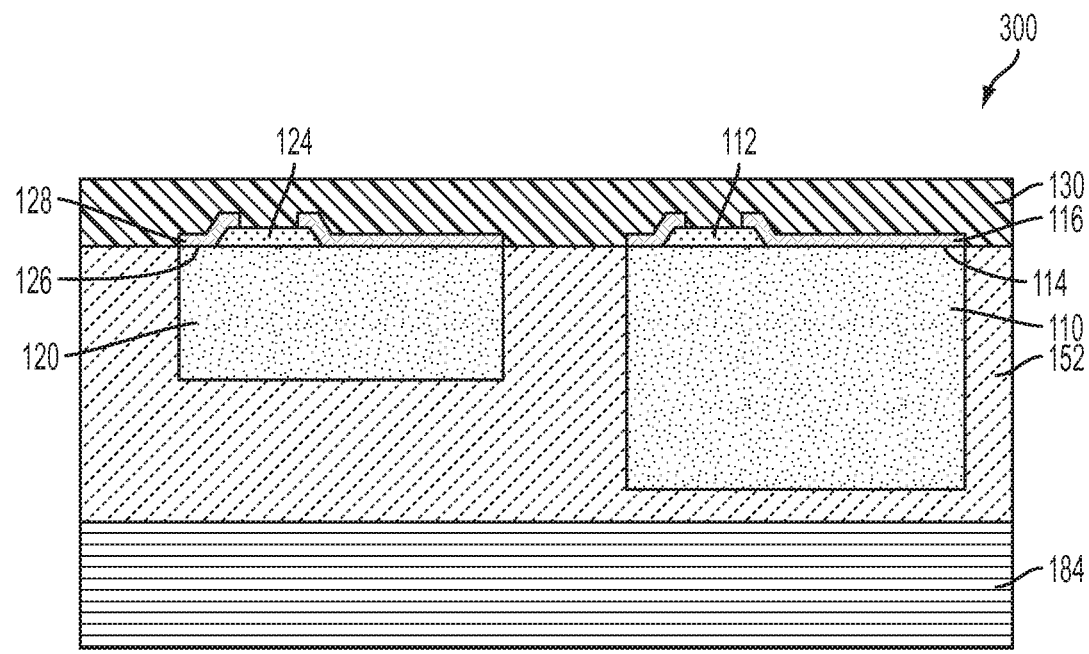

FIG. 3C is a cross-sectional view of the package 100 following operations 270 and 272 in accordance with one or more embodiments. The tape 182 and the first support surface 180 are removed and the package 100 is flipped. A first passivation layer 130 is deposited over the package 100.

Returning to FIG. 2, in operation 274, the first passivation layer is etched by a photolithography process to expose a conductive pad on the first chip and a conductive pad on the second chip.

In operation 276, a redistribution structure is deposited onto the first passivation layer and the conductive pad on the first chip and the conductive pad on the second chip to conductively couple the conductive pads. In some embodiments, excess redistribution structure is removed by a photolithography process.

Figure 3D:
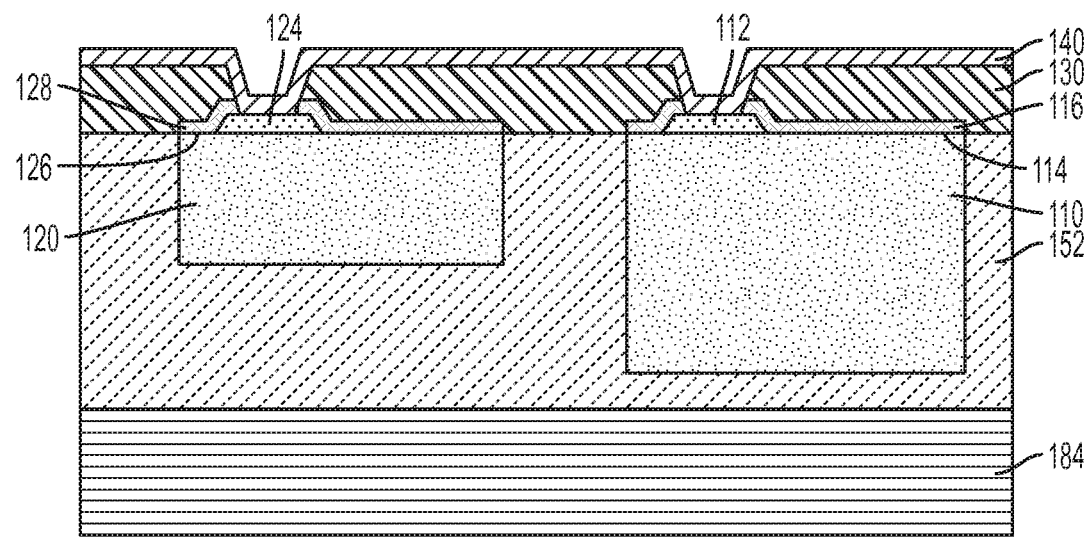

FIG. 3D is a cross-sectional view of the package 100 following operations 274 and 276 in accordance with one or more embodiments. The first passivation layer 130 is etched and the redistribution structure 140 is deposited onto the first passivation layer and the conductive pad 112 on the first chip 110 and the conductive pad 124 on the second chip 120 to conductively couple the conductive pads.

Returning to FIG. 2, in operation 278, a second passivation layer is deposited over the package. The second passivation layer is similar to the first passivation layer.

In operation 279, the passivation layers are etched by a photolithography process to create an optical opening to expose an optical component of the second chip. The second chip includes at least one optical component configured to process, receive, and/or transmit optical signals. FIG. 1 illustrates the package after operation 279 with the second planar surface 184 removed.

Figure 4A:
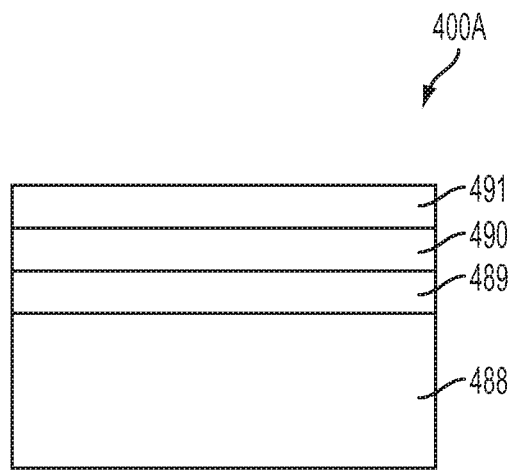
FIGS. 4A-4B are cross-sectional views of structures for conductive contact in accordance with one or more embodiments.

FIG. 4A is a cross-sectional view of a structure for conductive contact in accordance with one or more embodiments. A positively doped (p-type) contact layer 488, such as in the pad 124 of the second chip 120 (as illustrated in FIG. 1), has a first metal layer 489 over and in contact with the p-type contact layer, a second metal layer 490 over and in contact with the first metal layer, and a third metal layer 491 over and in contact with the second metal layer to form a p-type contact 400A. In some embodiments the first metal layer 488 includes titanium (Ti), the second metal layer 490 includes platinum (Pt) and the third metal layer 491 includes a titanium (Ti) nickel (Ni) alloy.

Figure 4B:
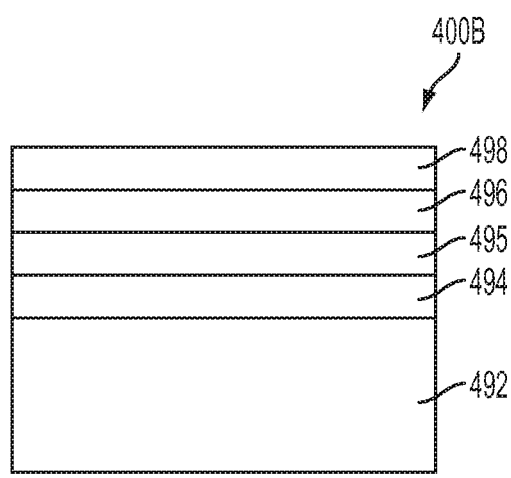

FIG. 4B is a cross-sectional view of a structure for conductive contact in accordance with one or more embodiments. A negatively doped (n-type) contact layer 492, such as in the pad 124 of the second chip 120 (as illustrated in FIG. 1), has a first metal layer 494 over and in contact with the n-type contact layer, a second metal layer 495 over and in contact with the first metal layer, a third metal layer 496 over and in contact with the second metal layer, and a fourth metal layer 498 over and in contact with the third metal layer to form an n-type contact 400B. In some embodiments the first metal layer 494 includes nickel (Ni), the second metal layer 495 includes a germanium (Ge) gold (Au) alloy, the third metal layer 496 includes nickel (Ni) and the fourth metal layer 498 includes a titanium (Ti) nickel (Ni) alloy.

One aspect of this description relates to a package for holding a plurality of heterogeneous integrated circuits. The package includes a first chip having a first conductive pad and a first substrate including a first semiconductor and a second chip having a second conductive pad and a second substrate including a second semiconductor, wherein the second semiconductor is different from the first semiconductor. The package also includes a molding structure, the first chip and the second chip embedded in the molding structure, a conductive structure over the first chip and conductively coupled to the first conductive pad and over the second chip and conductively coupled to the second conductive pad, and a passivation layer over the conductive structure, the passivation layer comprising an opening defined therein, the opening exposing a portion of the second chip.

Another aspect of this description relates to a package for holding a plurality of heterogeneous integrated circuits. The package includes a first chip having a first conductive pad and a first substrate including a first semiconductor and a second chip having a having a second conductive pad doped p-type, a third conductive pad doped n-type and a second substrate including a second semiconductor, wherein the second semiconductor is different from the first semiconductor. The second conductive pad includes a p-type contact on the second chip, a first metal layer over the p-type contact, a second metal layer over the first metal layer and a third metal layer over the second metal layer. The third conductive pad includes an n-type contact on the second chip, a fourth metal layer over the n-type contact, a fifth metal layer over the fourth metal layer, a sixth metal layer over the fifth metal layer and a seventh metal layer over the sixth metal layer. The package includes a molding structure, the first chip and the second chip embedded in the molding structure, a conductive structure over the first chip and conductively coupled to the first conductive pad and over the second chip and conductively coupled to the second conductive pad doped p-type or the third conductive pad doped n-type, and a passivation layer over the conductive structure, the passivation layer comprising an optical opening defined therein, the opening exposing an optical component of the second chip.

Yet another aspect of this description relates to a method of integrating heterogeneous integrated circuits. The method includes depositing tape onto a first support surface, depositing a first chip onto the tape, wherein the first chip has a first conductive pad and a first substrate including a first semiconductor, depositing a second chip onto the tape, wherein the second chip has a second conductive pad and a second substrate including a second semiconductor, wherein the second semiconductor is different from the first semiconductor, depositing a molding structure over the first chip, second chip and the tape, depositing a second support surface onto the molding structure, removing the tape and first support surface, depositing first passivation layer, etching first passivation layer, depositing a conductive structure to conductively couple the first pad and the second pad, and depositing a second passivation layer over the first passivation layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of integrating heterogeneous integrated circuits, comprising:
    depositing tape onto a first support surface;
    depositing a first chip onto the tape, wherein the first chip has a first conductive pad and a first substrate including a first semiconductor;
    depositing a second chip onto the tape, wherein the second chip has a second conductive pad and a second substrate including a second semiconductor, wherein the second semiconductor is different from the first semiconductor;
    depositing a molding structure over the first chip, the second chip, and the tape;
    depositing a second support surface onto the molding structure;
    removing the tape and the first support surface;
    depositing a first passivation layer;
    etching the first passivation layer;
    depositing a conductive structure to conductively couple the first pad and the second pad;
    depositing a second passivation layer over the first passivation layer; and
    etching the first passivation layer and the second passivation layer to form sidewalls extending from a top of the second passivation layer to a bottom of the first passivation layer, wherein the sidewalls define an optical opening exposing an optical component of the second chip.

2. The method of claim 1, wherein the molding structure includes a material selected from silicone, including silicone rubber, resin, including epoxy resins, and epoxy.

3. The method of claim 1, wherein the first semiconductor is silicon (Si) and the second semiconductor is a class III-V semiconductor compound.

4. The method of claim 1, wherein the second conductive pad is a n-type contact, the n-type contact comprising: a first nickel layer over the second substrate, a germanium-gold layer over the first nickel layer, a second nickel layer over the germanium-gold layer, and a layer comprising titanium or nickel over the second nickel layer.

5. The method of claim 1, wherein the second conductive pad is a p-type contact, the p-type contact comprising: a first titanium layer over the second substrate; a platinum layer over the first titanium layer; and a layer comprising titanium or nickel over the platinum layer.

6. A method of integrating heterogeneous integrated circuits, comprising:
    providing a first chip, wherein the first chip has a first conductive pad and a first substrate including a first semiconductor, and wherein the first conductive pad is a first n-type or p-type contact comprising a first multi-layer structure having an uppermost metal layer comprising titanium or nickel;
    providing a second chip, wherein the second chip has a second conductive pad and a second substrate including a second semiconductor, wherein the second semiconductor is different from the first semiconductor, and wherein the second conductive pad is a second n-type or p-type contact comprising a second multi-layer structure having an uppermost metal layer comprising titanium or nickel;
    depositing a molding structure over back-sides of the first and second chips;
    depositing a second support surface onto the molding structure;
    depositing a first passivation layer over front-sides of the first and second chips;
    etching the first passivation layer;
    depositing a conductive structure over the first passivation layer to conductively couple the first conductive pad and the second conductive pad; and
    depositing a second passivation layer over the conductive structure.

7. The method of claim 6, wherein the front-sides of the first and second chips are co-planar with a surface of the molding structure.

8. The method of claim 6, wherein the second conductive pad is the second n-type contact, the second n-type contact comprising: a first nickel layer over the second substrate, a germanium-gold layer over the first nickel layer, a second nickel layer over the germanium-gold layer, and a layer comprising titanium or nickel over the second nickel layer.

9. The method of claim 6, wherein the second conductive pad is the second p-type contact, the second p-type contact comprising: a first titanium layer over the second substrate; a platinum layer over the first titanium layer; and a layer comprising titanium or nickel over the platinum layer.

10. The method of claim 6, further comprising:
etching the first and second passivation layers to form an optical opening exposing an optical component of the second chip.

11. The method of claim 10:
wherein the first conductive pad is the first n-type contact, the first n-type contact comprising: a first metal layer over the second substrate, a second metal layer over the first metal layer, a third metal layer over the second metal layer, and a fourth metal layer over the third metal layer; and
wherein the second conductive pad is the second p-type contact, the second p-type contact comprising: a fourth metal layer over the second substrate; a fifth metal layer over the fourth metal layer; and a sixth metal layer over the fifth metal layer.

12. The method of claim 10:
wherein the first conductive pad is the first p-type contact, the first p-type contact comprising: a first metal layer over the second substrate; a second metal layer over the first metal layer; and a third metal layer over the second metal layer; and
wherein the second conductive pad is the second n-type contact, the second n-type contact comprising: a fourth metal layer over the second substrate, a fifth metal layer over the fourth metal layer, a sixth metal layer over the fifth metal layer, and a seventh metal layer over the sixth metal layer.

13. A method of integrating integrated circuits, comprising:
providing a first chip having a first conductive pad;
providing a second chip having a second conductive pad;
depositing a molding structure over back-sides of the first and second chips, wherein a top surface of the molding structure is co-planar with front-sides of the first and second chips;
depositing a second support surface onto the molding structure nearest the back-sides of the first and second chips;
depositing a first passivation layer over the front-sides of the first and second chips;
etching the first passivation layer;
depositing a conductive structure over the first passivation layer;
depositing a second passivation layer over the conductive structure; and
etching the first and second passivation layers to form sidewalls extending from a top of the second passivation layer to a bottom of the first passivation layer, wherein the sidewalls define an optical opening exposing an optical component of the second chip.

14. The method of claim 13, wherein the second conductive pad is a n-type contact, the n-type contact comprising: a first metal layer, a second metal layer over the first metal layer, a third metal layer over the second metal layer, and a fourth metal layer over the third metal layer.

15. The method of claim 13, wherein the second conductive pad is a p-type contact, the p-type contact comprising: a first metal layer; a second metal layer over the first metal layer; and a third metal layer over the second metal layer.

16. The method of claim 13, wherein the molding structure includes a material selected from silicone, including silicone rubber, resin, including epoxy resins, and epoxy.

17. The method of claim 13, wherein the first chip includes a silicon (Si) substrate and the second chip includes a class III-V semiconductor substrate.

18. The method of claim 1, further comprising:
forming a passivation layer over the first chip, wherein the first passivation layer is deposited in contact with upper surface of the passivation layer and the molding structure, and wherein the passivation layer has sidewalls that are aligned with a line extending along sidewalls of the first chip.

19. The method of claim 1,
wherein the first passivation layer has a lowermost surface contacting the molding structure;
wherein a lower surface of the conductive structure facing the molding structure contacts an uppermost surface of the first passivation layer; and
wherein the second passivation layer comprises a different material than the first passivation layer and has a lowermost surface contacting an upper surface of the conductive structure.

20. The method of claim 1, wherein the first conductive pad is a multi-layer structure having an uppermost metal layer comprising titanium or nickel.

* * * * *